(12) United States Patent
Chow et al.

(10) Patent No.: US 8,049,281 B1
(45) Date of Patent: Nov. 1, 2011

(54) SYMMETRIC NON-INTRUSIVE AND COVERT TECHNIQUE TO RENDER A TRANSISTOR PERMANENTLY NON-OPERABLE

(75) Inventors: Lap-Wai Chow, South Pasadena, CA (US); William M. Clark, Jr., Camarillo, CA (US); Gavin J. Harbison, Marina del Rey, CA (US); Paul Ou Yang, San Jose, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 12/960,126

(22) Filed: Dec. 3, 2010

Related U.S. Application Data

(63) Continuation of application No. 11/807,896, filed on May 29, 2007, now Pat. No. 7,935,603.

(51) Int. Cl.
*H01L 29/76* (2006.01)

(52) U.S. Cl. ......... 257/369; 257/344; 257/408; 257/900

(58) Field of Classification Search .................. 257/369, 257/344, 408, 900
See application file for complete search history.

(56) References Cited

U.S. PATENT DOCUMENTS

| | | | |
|---|---|---|---|
| 3,673,471 A | 6/1972 | Klein et al. .................. 257/407 |
| 3,946,426 A | 3/1976 | Sanders ........................... 357/71 |
| 3,983,620 A | 10/1976 | Spadea .......................... 438/218 |
| 4,017,888 A | 4/1977 | Christie et al. .................. 357/54 |
| 4,101,344 A | 7/1978 | Kooi et al. ....................... 148/1.5 |
| 4,139,864 A | 2/1979 | Schulman ...................... 358/188 |
| 4,143,854 A | 3/1979 | Vetter .............................. 254/93 |
| 4,145,701 A | 3/1979 | Kawagoe ...................... 257/391 |
| 4,164,461 A | 8/1979 | Schilling .................. 204/192 EC |
| 4,196,443 A | 4/1980 | Dingwall ....................... 257/774 |
| 4,267,578 A | 5/1981 | Vetter ............................ 364/709 |
| 4,291,391 A | 9/1981 | Chatterjee et al. ............. 365/184 |
| 4,295,897 A | 10/1981 | Tubbs et al. ................... 148/1.5 |
| 4,314,268 A | 2/1982 | Yoshioka et al. ............... 357/48 |
| 4,317,273 A | 3/1982 | Guterman et al. .............. 29/571 |
| 4,322,736 A | 3/1982 | Sasaki et al. .................. 257/369 |
| 4,374,454 A | 2/1983 | Jochems .......................... 29/571 |
| 4,393,575 A | 7/1983 | Dunkley et al. ............... 438/186 |
| 4,409,434 A | 10/1983 | Basset et al. .................. 380/265 |
| 4,435,895 A | 3/1984 | Parillo ............................ 29/571 |
| 4,471,376 A | 9/1984 | Morcom et al. ................. 357/71 |
| 4,493,740 A | 1/1985 | Komeda ........................ 438/431 |
| 4,530,150 A | 7/1985 | Shirato ........................ 29/576 B |
| 4,581,628 A | 4/1986 | Miyauchi et al. ............... 357/71 |

(Continued)

FOREIGN PATENT DOCUMENTS

EP 0 186 855 A2 7/1986

(Continued)

OTHER PUBLICATIONS

U.S. Appl. No. 09/391,258, filed Sep. 7, 1999, Baukus.

(Continued)

*Primary Examiner* — Samuel Gebremariam
(74) *Attorney, Agent, or Firm* — Ladas & Parry

(57) ABSTRACT

A technique for and structures for camouflaging an integrated circuit structure. The technique including forming active areas of a first conductivity type and LDD regions of a second conductivity type resulting in a transistor that is always non-operational when standard voltages are applied to the device.

16 Claims, 6 Drawing Sheets

U.S. PATENT DOCUMENTS

| | | | | |
|---|---|---|---|---|
| 4,583,011 A | 4/1986 | Pechar | | 307/440 |
| 4,603,381 A | 7/1986 | Guttag et al. | | 364/200 |
| 4,623,255 A | 11/1986 | Suszko | | 356/389 |
| 4,636,822 A | 1/1987 | Codella et al. | | 257/282 |
| 4,727,038 A | 2/1988 | Watabe | | 438/304 |
| 4,727,493 A | 2/1988 | Taylor, Sr. | | 364/490 |
| 4,729,001 A | 3/1988 | Haskell | | 257/345 |
| 4,753,897 A | 6/1988 | Lund et al. | | 437/41 |
| 4,766,516 A | 8/1988 | Ozdemir et al. | | 361/380 |
| 4,771,012 A | 9/1988 | Yabu et al. | | 438/286 |
| 4,799,096 A | 1/1989 | Koeppe | | 357/42 |
| 4,814,854 A | 3/1989 | Tigelaar et al. | | 257/382 |
| 4,821,085 A | 4/1989 | Haken et al. | | 357/67 |
| 4,829,356 A | 5/1989 | Arndt | | 357/35 |
| 4,830,974 A | 5/1989 | Chang et al. | | 437/34 |
| 4,860,084 A | 8/1989 | Shibata | | 257/288 |
| 4,912,053 A | 3/1990 | Schrantz | | 438/188 |
| 4,927,777 A | 5/1990 | Hsu et al. | | 438/305 |
| 4,931,411 A | 6/1990 | Tigelaar et al. | | 438/201 |
| 4,939,567 A | 7/1990 | Kenney | | 257/383 |
| 4,962,484 A | 10/1990 | Takeshima et al. | | 365/226 |
| 4,975,756 A | 12/1990 | Haken et al. | | 357/4.1 |
| 4,998,151 A | 3/1991 | Korman et al. | | 257/328 |
| 5,015,596 A | 5/1991 | Toyoda et al. | | 437/41 |
| 5,030,796 A | 7/1991 | Swanson et al. | | 174/52.2 |
| 5,050,123 A | 9/1991 | Castro | | 365/53 |
| 5,061,978 A | 10/1991 | Mizutani et al. | | 357/30 |
| 5,065,208 A | 11/1991 | Shah et al. | | 357/34 |
| 5,068,697 A | 11/1991 | Noda et al. | | 357/23.5 |
| 5,070,378 A | 12/1991 | Yamagata | | 357/23.5 |
| 5,073,812 A | 12/1991 | Shimura | | 357/34 |
| 5,101,121 A | 3/1992 | Sourgen | | 307/465 |
| 5,117,276 A | 5/1992 | Thomas et al. | | 357/71 |
| 5,120,669 A | 6/1992 | Schrantz | | 437/41 |
| 5,121,089 A | 6/1992 | Larson et al. | | 333/107 |
| 5,121,186 A | 6/1992 | Wong et al. | | 257/384 |
| 5,132,571 A | 7/1992 | McCollum et al. | | 307/465.1 |
| 5,138,197 A | 8/1992 | Kuwana | | 307/449 |
| 5,146,117 A | 9/1992 | Larson et al. | | 307/465 |
| 5,168,340 A | 12/1992 | Nishimura | | 357/376 |
| 5,177,589 A | 1/1993 | Kobayashi et al. | | 257/773 |
| 5,202,591 A | 4/1993 | Walden | | 307/450 |
| 5,210,437 A | 5/1993 | Sawada et al. | | 257/392 |
| 5,225,699 A | 7/1993 | Nakamura | | 257/306 |
| 5,227,649 A | 7/1993 | Chapman | | 257/204 |
| 5,231,299 A | 7/1993 | Ning et al. | | 257/316 |
| 5,302,539 A | 4/1994 | Haken et al. | | 437/41 |
| 5,308,682 A | 5/1994 | Morikawa | | 428/195 |
| 5,309,015 A | 5/1994 | Kuwata et al. | | 257/659 |
| 5,317,197 A | 5/1994 | Roberts | | 257/401 |
| 5,336,624 A | 8/1994 | Walden | | 438/200 |
| 5,341,013 A | 8/1994 | Koyanagi et al. | | 257/368 |
| 5,345,105 A | 9/1994 | Sun et al. | | 257/659 |
| 5,354,704 A | 10/1994 | Yang et al. | | 437/52 |
| 5,369,299 A | 11/1994 | Byrne et al. | | 257/638 |
| 5,371,390 A | 12/1994 | Mohsen | | 257/209 |
| 5,371,443 A | 12/1994 | Sun et al. | | 315/247 |
| 5,376,577 A | 12/1994 | Roberts et al. | | 437/52 |
| 5,378,641 A | 1/1995 | Cheffings | | 438/302 |
| 5,384,472 A | 1/1995 | Yin | | 257/204 |
| 5,384,475 A | 1/1995 | Yahata | | 257/314 |
| 5,399,441 A | 3/1995 | Bearinger et al. | | 428/689 |
| 5,404,040 A | 4/1995 | Hshieh et al. | | 257/341 |
| 5,412,237 A | 5/1995 | Komori et al. | | 257/306 |
| 5,441,902 A | 8/1995 | Hsieh et al. | | 437/34 |
| 5,453,635 A | 9/1995 | Hsu | | 257/336 |
| 5,468,990 A | 11/1995 | Daum | | 257/632 |
| 5,475,251 A | 12/1995 | Kuo et al. | | 257/376 |
| 5,506,806 A | 4/1996 | Fukushima | | 365/195 |
| 5,510,279 A | 4/1996 | Chien et al. | | 438/302 |
| 5,531,018 A | 7/1996 | Saia et al. | | 29/622 |
| 5,539,224 A | 7/1996 | Ema | | 257/211 |
| 5,541,614 A | 7/1996 | Lam et al. | | 343/792.5 |
| 5,571,735 A | 11/1996 | Mogami et al. | | 437/41 |
| 5,576,988 A | 11/1996 | Kuo et al. | | 365/185.04 |
| 5,580,804 A | 12/1996 | Joh | | 438/231 |
| 5,585,658 A | 12/1996 | Mukai et al. | | 257/344 |
| 5,611,940 A | 3/1997 | Zettler | | 73/514.16 |
| 5,635,749 A | 6/1997 | Hong | | 257/402 |
| 5,638,946 A | 6/1997 | Zavracky | | 200/181 |
| 5,650,340 A | 7/1997 | Burr et al. | | 438/286 |
| 5,675,172 A | 10/1997 | Miyamoto et al. | | 257/402 |
| 5,677,557 A | 10/1997 | Wuu et al. | | 257/382 |
| 5,679,595 A | 10/1997 | Chen et al. | | 437/52 |
| 5,702,972 A | 12/1997 | Tsai et al. | | 438/305 |
| 5,719,422 A | 2/1998 | Burr et al. | | 257/336 |
| 5,719,430 A | 2/1998 | Goto | | 257/403 |
| 5,721,150 A | 2/1998 | Pasch | | 437/46 |
| 5,744,372 A | 4/1998 | Bulucea | | 438/231 |
| 5,763,916 A | 6/1998 | Gonzalez et al. | | 257/345 |
| 5,783,375 A | 7/1998 | Twist | | 430/414 |
| 5,783,846 A | 7/1998 | Baukus et al. | | 257/204 |
| 5,789,298 A | 8/1998 | Gardner et al. | | 438/286 |
| 5,811,340 A | 9/1998 | Park | | 438/291 |
| 5,821,590 A | 10/1998 | Lee et al. | | 257/377 |
| 5,831,306 A | 11/1998 | Gardner et al. | | 257/344 |
| 5,834,356 A | 11/1998 | Bothra et al. | | 438/384 |
| 5,834,809 A | 11/1998 | Kato et al. | | 257/335 |
| 5,838,047 A | 11/1998 | Yamauchi et al. | | 257/372 |
| 5,854,510 A | 12/1998 | Sur, Jr. et al. | | 257/529 |
| 5,858,843 A | 1/1999 | Doyle et al. | | 438/299 |
| 5,866,933 A | 2/1999 | Baukus et al. | | 257/368 |
| 5,874,328 A | 2/1999 | Liu et al. | | |
| 5,877,050 A | 3/1999 | Gardner et al. | | 438/231 |
| 5,880,503 A | 3/1999 | Matsumoto et al. | | 257/372 |
| 5,888,887 A | 3/1999 | Li et al. | | 438/525 |
| 5,891,782 A | 4/1999 | Hsu et al. | | 438/302 |
| 5,895,241 A | 4/1999 | Lu et al. | | 438/275 |
| 5,909,622 A | 6/1999 | Kadosh et al. | | 438/286 |
| 5,920,097 A | 7/1999 | Horne | | 257/368 |
| 5,925,914 A | 7/1999 | Jiang | | 257/344 |
| 5,930,663 A | 7/1999 | Baukus et al. | | 438/598 |
| 5,930,667 A | 7/1999 | Oda | | 438/622 |
| 5,933,737 A | 8/1999 | Goto | | 438/291 |
| 5,960,291 A | 9/1999 | Krivokapic | | 438/286 |
| 5,973,375 A | 10/1999 | Baukus et al. | | 257/399 |
| 5,977,593 A | 11/1999 | Hara | | 257/356 |
| 5,998,257 A | 12/1999 | Lane et al. | | 438/253 |
| 5,998,272 A | 12/1999 | Ishida et al. | | 438/305 |
| 6,010,929 A | 1/2000 | Chapman | | 438/226 |
| 6,020,227 A | 2/2000 | Bulucea | | 438/194 |
| 6,030,869 A | 2/2000 | Odake et al. | | 438/266 |
| 6,031,272 A | 2/2000 | Hiroki et al. | | 257/404 |
| 6,037,627 A | 3/2000 | Kitamura et al. | | 257/324 |
| 6,044,011 A | 3/2000 | Marr | | 375/154 |
| 6,046,659 A | 4/2000 | Loo et al. | | 333/262 |
| 6,054,659 A | 4/2000 | Lee et al. | | 200/181 |
| 6,057,520 A | 5/2000 | Goodwin-Johansson | | 200/181 |
| 6,064,110 A | 5/2000 | Baukus et al. | | 257/652 |
| 6,078,080 A | 6/2000 | Kadosh et al. | | 257/344 |
| 6,080,614 A | 6/2000 | Neilson et al. | | 438/238 |
| 6,084,248 A | 7/2000 | Inoue | | 257/66 |
| 6,090,692 A | 7/2000 | Song | | 438/592 |
| 6,093,609 A | 7/2000 | Chuang | | 438/286 |
| 6,103,563 A | 8/2000 | Lukanc et al. | | 438/231 |
| 6,117,762 A | 9/2000 | Baukus et al. | | 438/618 |
| 6,137,318 A | 10/2000 | Takaaki | | 326/112 |
| 6,146,952 A | 11/2000 | Nariman et al. | | 438/286 |
| 6,153,484 A | 11/2000 | Donaton et al. | | 438/301 |
| 6,154,388 A | 11/2000 | Oh | | 365/185.04 |
| 6,215,158 B1 | 4/2001 | Choi | | 257/368 |
| 6,242,329 B1 | 6/2001 | Huster et al. | | 438/531 |
| 6,255,174 B1 | 7/2001 | Yu | | 438/286 |
| 6,261,912 B1 | 7/2001 | Hsiao et al. | | 438/301 |
| 6,294,816 B1 | 9/2001 | Baukus et al. | | 257/368 |
| 6,316,303 B1 | 11/2001 | Lin et al. | | 438/222 |
| 6,326,675 B1 | 12/2001 | Scott et al. | | 257/608 |
| 6,337,249 B1 | 1/2002 | Yamane et al. | | 438/279 |
| 6,365,453 B1 | 4/2002 | Deboer et al. | | 438/253 |
| 6,373,106 B2 | 4/2002 | Maki et al. | | 257/369 |
| 6,380,041 B1 | 4/2002 | Yeap et al. | | 438/302 |
| 6,384,457 B2 | 5/2002 | Tyagi et al. | | 257/408 |
| 6,399,452 B1 | 6/2002 | Krishnan et al. | | 438/305 |
| 6,410,413 B2 | 6/2002 | Scott et al. | | 438/601 |
| 6,455,388 B1 | 9/2002 | Lai et al. | | 438/303 |
| 6,465,315 B1 | 10/2002 | Yu | | 438/306 |
| 6,466,489 B1 | 10/2002 | Ieong et al. | | 365/189.09 |

| Patent No. | Date | Inventor | Class |
|---|---|---|---|
| 6,479,350 B1 | 11/2002 | Ling et al. | 438/265 |
| 6,503,787 B1 | 1/2003 | Choi | 438/214 |
| 6,534,787 B1 | 3/2003 | Hsu | 257/66 |
| 6,566,204 B1 | 5/2003 | Wang et al. | 438/286 |
| 6,613,661 B1 | 9/2003 | Baukus | 438/598 |
| 6,740,942 B2 | 5/2004 | Baukus et al. | 257/406 |
| 6,746,924 B1 | 6/2004 | Lee et al. | 438/286 |
| 6,815,816 B1 | 11/2004 | Clark, Jr. et al. | 257/734 |
| 6,825,530 B1 | 11/2004 | Brown et al. | 257/337 |
| 6,833,307 B1 | 12/2004 | Wristers et al. | 438/302 |
| 6,833,589 B2 | 12/2004 | Matsuhashi et al. | 257/350 |
| 6,911,694 B2 | 6/2005 | Negoro et al. | 257/336 |
| 6,919,600 B2 | 7/2005 | Baukus | 257/341 |
| 6,921,690 B2 | 7/2005 | Church | 438/241 |
| 6,930,361 B2 | 8/2005 | Inaba | 257/408 |
| 6,933,560 B2 | 8/2005 | Lee et al. | 257/328 |
| 7,012,273 B2 | 3/2006 | Chen | 257/4 |
| 7,091,114 B2 | 8/2006 | Ito | 438/527 |
| 7,179,712 B2 | 2/2007 | Hoefler | 438/278 |
| 7,195,266 B2 | 3/2007 | Ricke et al. | 280/280 |
| 7,208,383 B1 | 4/2007 | Weintraub et al. | 438/302 |
| 7,217,977 B2 * | 5/2007 | Chow et al. | 257/344 |
| 7,242,063 B1 * | 7/2007 | Chow et al. | 257/369 |
| 2001/0042892 A1 | 11/2001 | Okada | 257/382 |
| 2002/0043689 A1 | 4/2002 | Matsuoka et al. | 257/368 |
| 2002/0058368 A1 | 5/2002 | Tseng | 438/183 |
| 2002/0096776 A1 | 7/2002 | Chow | 257/774 |
| 2002/0173131 A1 | 11/2002 | Clark, Jr. et al. | 438/598 |
| 2003/0057476 A1 | 3/2003 | Morita et al. | 257/327 |
| 2003/0127709 A1 | 7/2003 | Lippmann | 257/758 |
| 2003/0173622 A1 | 9/2003 | Porter et al. | 257/355 |
| 2003/0205816 A1 | 11/2003 | Janke | 257/758 |
| 2004/0061186 A1 | 4/2004 | Chow et al. | 257/399 |
| 2004/0075147 A1 | 4/2004 | Ueda et al. | 257/368 |
| 2004/0099912 A1 | 5/2004 | Chow et al. | 257/368 |
| 2004/0144998 A1 | 7/2004 | Chow et al. | 257/213 |
| 2004/0164361 A1 | 8/2004 | Baukus et al. | 257/402 |
| 2005/0082625 A1 | 4/2005 | Kim | 257/412 |
| 2005/0230787 A1 | 10/2005 | Chow et al. | 257/629 |
| 2006/0105489 A1 | 5/2006 | Rhodes | 438/48 |

FOREIGN PATENT DOCUMENTS

| | | |
|---|---|---|
| EP | 0 364 769 | 4/1990 |
| EP | 0 463 373 | 1/1992 |
| EP | 0 528 302 A1 | 2/1993 |
| EP | 0 585 601 A1 | 3/1994 |
| EP | 0 764 985 A2 | 3/1997 |
| EP | 0 883 184 A2 | 12/1998 |
| EP | 0 920 057 A2 | 6/1999 |
| EP | 1 193 758 A1 | 4/2002 |
| EP | 1 202 353 A1 | 5/2002 |
| FR | 2 486 717 | 1/1982 |
| JP | S58-016565 | 7/1982 |
| JP | 58-190064 | 11/1983 |
| JP | S59-035465 | 2/1984 |
| JP | 61-147551 | 7/1986 |
| JP | 61-201472 | 9/1986 |
| JP | 63-129647 A | 6/1988 |
| JP | H01-213350 | 8/1989 |
| JP | 02-046762 | 2/1990 |
| JP | H02-062118 | 3/1990 |
| JP | 02-188944 | 7/1990 |
| JP | 02-237038 | 9/1990 |
| JP | H02-237038 | 9/1990 |
| JP | 04-028092 | 1/1992 |
| JP | H04-267553 | 9/1992 |
| JP | 05-218849 | 8/1993 |
| JP | H05-218849 | 8/1993 |
| JP | H08-274041 | 10/1996 |
| JP | 10-256398 | 9/1998 |
| JP | 2000-040809 | 2/2000 |
| JP | 2000-040810 | 2/2000 |
| WO | 98/21734 | 5/1998 |
| WO | 98/57373 | 12/1998 |
| WO | 00/44012 | 7/2000 |
| WO | 0055889 | 9/2000 |

OTHER PUBLICATIONS

U.S. Appl. No. 09/758,792, filed Jan. 11, 2001, Baukus.
U.S. Appl. No. 09/758,792.
U.S. Appl. No. 10/828,022, filed Apr. 19, 2004, Chow et al.
Blythe, et al., "Layout Reconstruction of Complex Silicon Chips," IEEE Journal of Solid-State Circuits, vol. 28, No. 2, pp. 138-145 (Feb. 1993).
Frederiksen, Thomas M., "Standard Circuits in the New CMOS Era," Intuitive CMOS Electronics, Revised Edition, pp. 134-146 (Jan. 1989).
Hodges and Jackson, Analysis and Design of Digital Integrated Circuits, 2nd edition, McGraw-Hill, p. 353 (1988).
IBM_TDB, "Double Polysilicon Dynamic Memory Cell with Polysilicon Bit Line," vol. 21, Issue No. 9, pp. 3828-3831 (Feb. 1979).
IBM_TDB, "Static Ram Double Polysilicon Process," vol. 23, Issue No. 8 pp. 3683-3686 (Jan. 1981).
Larson, L.E., et al., "Microactuators for GaAs-based Microwave Integrated Circuits," IEEE, pp. 743-746 (1991).
Lee, "Engineering a Device for Electron-Beam Probing," IEEE Design and Test of Computers, pp. 36-49 (Jun. 1989).
Ng, K.K., Complete Guide to Semiconductor Devices, McGraw-Hill, Inc., pp. 164-165 (1995).
Sze, S.M., VLSI Technology, McGraw-Hill, pp. 99, 447, 461-465 (1983).
Sze, S.M., ed., "Silicides for Gates and Interconnections," VLSI Technology, McGraw-Hill, pp. 372-380 (1983).
VLSI manufacturing process, pp. 172 and 279, published 1997 in Taiwan (untranslated).
Office action dated May 28, 2002 from Taiwanese Patent No. 201664 with its English translation.
Office action mailed on Feb. 8, 2011 for Japanese Patent Application No. 2000-614502 and its English translation.

* cited by examiner

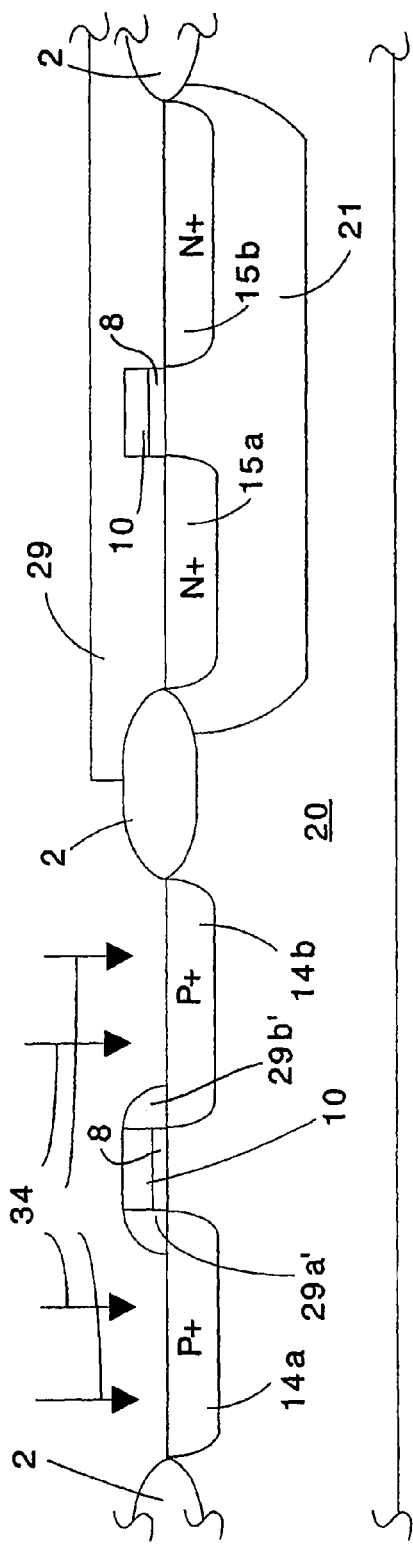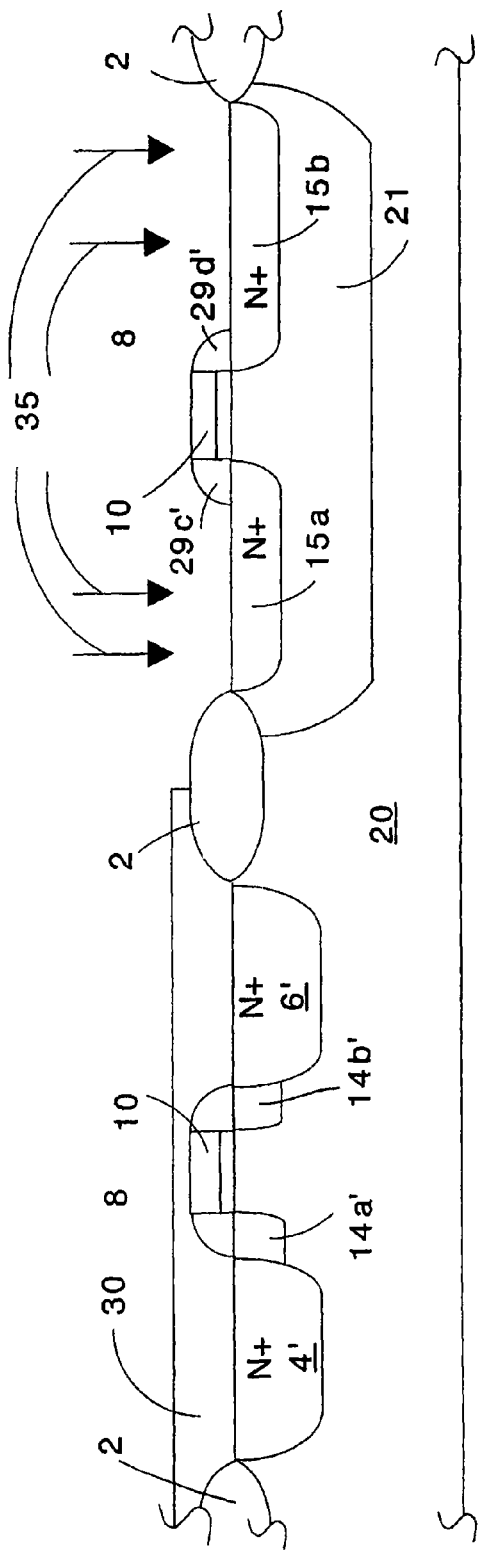
Figure 4a
Figure 4b

US 8,049,281 B1

SYMMETRIC NON-INTRUSIVE AND COVERT TECHNIQUE TO RENDER A TRANSISTOR PERMANENTLY NON-OPERABLE

CROSS REFERENCE TO RELATED APPLICATIONS

This is a continuation application of U.S. patent application Ser. No. 11/807,896, filed on May 29, 2007, which is incorporated herein as though set forth in full. This application is a divisional application of U.S. application Ser. No. 10/881,286, filed on Jun. 29, 2004, which has been allowed. This application is also related to U.S. Pat. No. 7,217,977 entitled "Covert Transformation of Transistor Properties as a Circuit Protection Method," the disclosure of which is incorporated herein by reference.

TECHNICAL FIELD

The present invention relates to integrated circuits (ICs) and semiconductor devices in general and their methods of manufacture wherein the integrated circuits and semiconductor devices employ camouflaging techniques which make it difficult for the reverse engineer to discern how the semiconductor device functions by rendering devices, which appear to be normally functioning devices, non-operable (i.e. OFF).

RELATED ART

The present invention is related to the following US patents and patent applications by some of the same inventors as the present inventors:
(1) U.S. Pat. Nos. 5,866,933; 5,783,375 and 6,294,816 teach transistors in a CMOS circuit that are connected by implanted (and therefore hidden and buried) lines between the transistors by modifying the p+ and n+ source/drain masks. These implanted interconnections form 3-input AND or OR circuits that look substantially identical to the reverse engineer. Also, buried interconnects force the reverse engineer to examine the IC in greater depth to try to figure out the connectivity between transistors and hence their function.
(2) U.S. Pat. Nos. 5,783,846; 5,930,663 and 6,064,110 teach a further modification in the implant masks so that the implanted connecting lines between transistors have a gap inserted, with approximately the length of the minimum feature size of the CMOS technology being used. If this gap is "filled" with one kind of implant, the line conducts; but if it is "filled" with another kind of implant, the line does not conduct. The intentional gaps are called "channel blocks." The reverse engineer is forced to determine connectivity on the basis of resolving the implant type at the minimum feature size of the CMOS process being used.
(3) U.S. Pat. No. 6,117,762 teaches a method and apparatus for protecting semiconductor integrated circuits from reverse engineering. Semiconductor active areas are formed on a substrate and a silicide layer is formed both over at least one active area of the semiconductor active areas and over a selected substrate area for interconnecting the at least one active area with another area through the silicide area formed on the selected substrate area. This connection, as affected by the silicide layer, is substantially invisible to the reverse engineer unless imaged via cross-sectional techniques which are prohibitively costly and time consuming.
(4) U.S. Pat. No. 7,217,977 noted above teaches forming semiconductor active areas on a substrate of a first conductivity type and placing a lightly doped density active area of a second conductivity type on one side of the gate. The size of the lightly doped density active is slightly larger than the standard lightly doped density active to prevent punch through.
(5) Co-pending U.S. Patent Application No. 60/414,216 filed on Sep. 27, 2002 discloses modifying a silicide layer mask such that an artifact edge of the silicide layer a reverse engineer would see when reverse engineering devices manufactured with other reverse engineering detection prevention techniques does not indicate the camouflaging technique being used.

BACKGROUND OF THE INVENTION

The creation of complex integrated circuits and semiconductor devices can be a very expensive undertaking given the large number of hours of sophisticated engineering talent involved in designing such devices. Additionally, integrated circuits can include read only memories and/or EEPROMs into which software, in the form of firmware, is encoded. Additionally, integrated circuits are often used in applications involving the encryption of information. Therefore in order to keep such information confidential (i.e. design, critical information and encryption), it is desirable to keep such devices from being reverse engineered. Thus, there are a variety of reasons for protecting integrated circuits and other semiconductor devices from being reversed engineered.

In order to keep the reverse engineer at bay, different techniques are known in the art to make integrated circuits more difficult to reverse engineer. One technique is to alter the composition or structures of the transistors in the circuit in such a way that the alteration is not easily apparent, forcing the reverse engineer to carefully analyze each transistor (in particular, each CMOS transistor pair for CMOS devices), and thwarting attempts to use automatic circuit and pattern recognition techniques in order to reverse engineer an integrated circuit. Since integrated circuits can have hundreds of thousands or even millions of transistors, forcing the reverse engineer to carefully analyze each transistor in a device can effectively frustrate the reverse engineer's ability to reverse engineer the device successfully.

A conductive layer, such as silicide, is often used during the manufacturing of semiconductor devices. In modern CMOS processing, especially with a feature size below 0.5 µm, a silicide layer is utilized to improve the conductivity of gate, source and drain contacts. In accordance with general design rules, any active region providing a source or drain is silicided. This silicide layer is very thin and difficult for the reverse engineer to see. Hence, if there are ways to modify the transistor through the modification of the silicide layer so as to change the transistor functionality then the modification would be difficult to determine.

FIG. 1 depicts a prior art modern CMOS device. The substrate 20 is a p-type substrate. Referring to the NMOS device, active areas 4, 6 disposed in the substrate 20 have n-type conductivity. The lightly doped density (LDD) active regions 14 have the same conductivity type as active areas 4, 6, but with a much lower dose than active areas 4, 6. The gate comprises a gate oxide layer 8, and a self-aligned polysilicon gate 10. Oxide sidewall spacers 16 form the differentiation between the active areas 4,6 and the LDD regions 14. Field oxide 2 provides separation between transistors. Referring to the PMOS device, a well 21 of n-type conductivity is disposed in the substrate 20. Active areas 23, 25 having p-type conductivity are disposed within n-type well 21. LDD regions 15 have the same conductivity type as active areas 23,25, but with a much lower dose than active areas 23, 25. The gate comprises a gate oxide layer 8 and a selfaligned polysilicon gate structure 10. Oxide sidewall spacers 16 form the differentiation between the active areas 23,25 and the LDD regions 15. The silicide layer 12 is deposited and sintered over the active areas 4, 6, 23, 25 to make better contact. The silicide layer 12 is optionally deposited over the poly gates 10 as well. For the prior art CMOS device of FIG. 1, the NMOS or PMOS transistors normally turn "ON" when a voltage is applied to $V_1$ 51 or $V_2$ 50, respectively.

Many other prior art techniques for discouraging or preventing reverse engineering of a circuit cause the IC to look different from a standard IC. What is needed are techniques in which the transistors, and thus the circuits, are constructed to look essentially the same as conventional circuits, but where the functionality of selected transistors is varied. The minor differences between the conventional circuit and the modified circuit should be difficult to detect by reverse engineering processes. In addition, the techniques should strive to modify only a vendor's library design instead of forming a completely new and differently appearing library. Requiring only modification to an existing library results in a simpler path to implementation.

SUMMARY OF THE INVENTION

It is an object of this invention to make reverse engineering even more difficult and, in particular, to use LDD regions of opposite type from the active areas resulting in a transistor that is always off when standard voltages are applied to the device. It is believed that this will make the reverse engineer's efforts all the more difficult in terms of making it very time consuming and perhaps exceedingly impractical, if not impossible, to reverse engineer a chip employing the present invention.

The Inventors named herein have previously filed Patent Applications and have received Patents in this general area of technology, that is, relating to the camouflage of integrated circuit devices in order to make it more difficult to reverse engineer them. The present invention can be used harmoniously with the techniques disclosed above in the prior United States Patents to further confuse the reverse engineer.

Note that the present invention might only be used in one in a thousand instances on the chip in question, but the reverse engineer will have to look very carefully at each transistor or connection knowing full well that for each transistor or connection that he or she sees, there is a very low likelihood that it has been modified by the present invention. The reverse engineer will be faced with having to find the proverbial needle in a haystack.

The present invention comprises a method of manufacturing a semiconductor device in which some selected non-operable transistors look the same as the operable transistors, but which have modified LDD implants. The modified LDD implants are of an opposite conductivity type than the conductivity of the transistor, and hence these implants will result in a transistor that will not turn on when biased.

In another aspect, depending on the design rules of the fabrication process, the present invention will offset the active areas of the transistor so as to increase the dimensions of the oppositely charged LDD regions to keep the transistor OFF.

In another aspect, depending upon the other camouflage techniques being used, the silicide layer may be placed on the device in a manner such that the silicide layer placed on a transistor having sidewall spacers is in the same position as the silicide layer placed on a transistor not having sidewall spacers.

DESCRIPTION OF THE DRAWINGS

FIGS. 4a-4c depict various steps in the manufacturing of another camouflaged integrated circuit structure in accordance with another embodiment of the present invention wherein the LDD regions are slightly larger, and the active regions are slightly smaller than the standard circuit structure.

DETAILED DESCRIPTION

Semiconductor device manufacturing employs many techniques, process steps, and technologies that are well known. These techniques, process steps and technologies vary with feature size, material composition and other specific device attributes. The following discussions are general discussions regarding modifications that may be made to the masks used in manufacturing a CMOS device. The discussions below are provided as examples only of possible embodiments of the presently disclosed technology.

Figure 1:
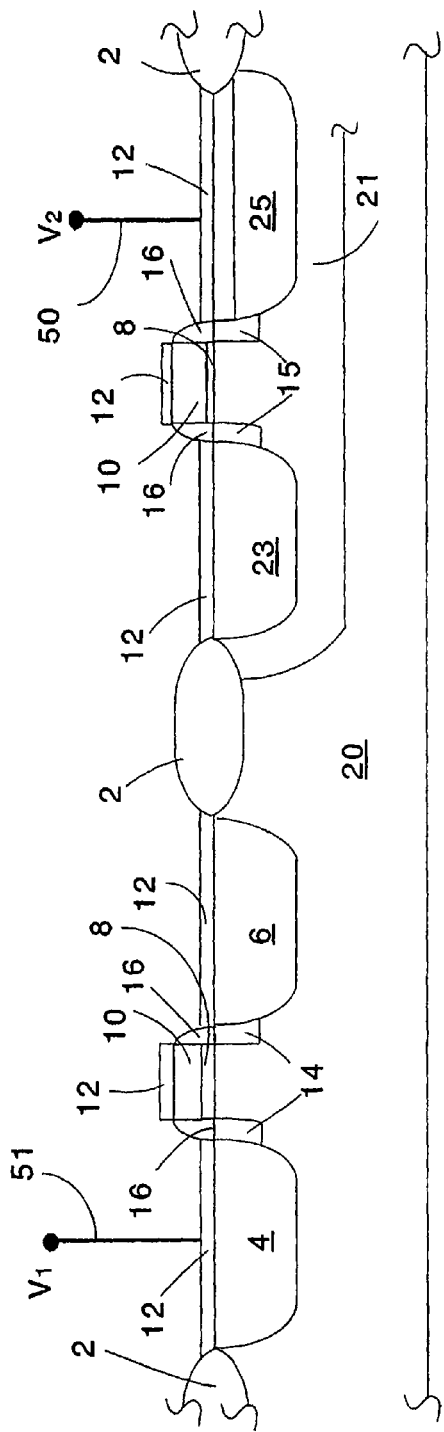
FIG. 1 depicts a prior art cross-section of a CMOS device with conventional LDD regions.
Figure 2A:
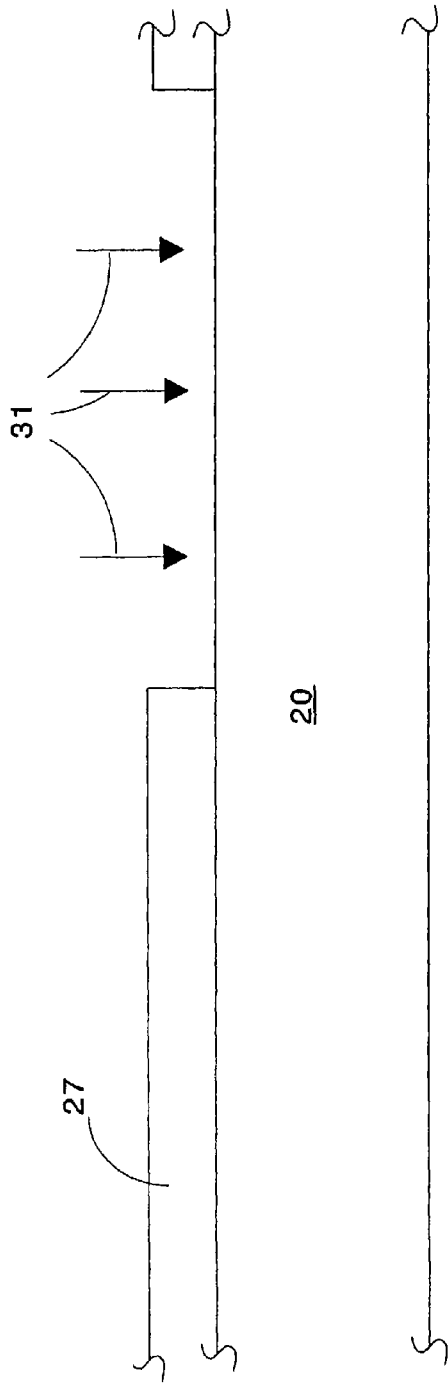
FIGS. 2a through 2f depict various steps in the manufacturing of a camouflaged integrated circuit structure having oppositely doped LDD regions in accordance with the present invention.
Figure 2B:
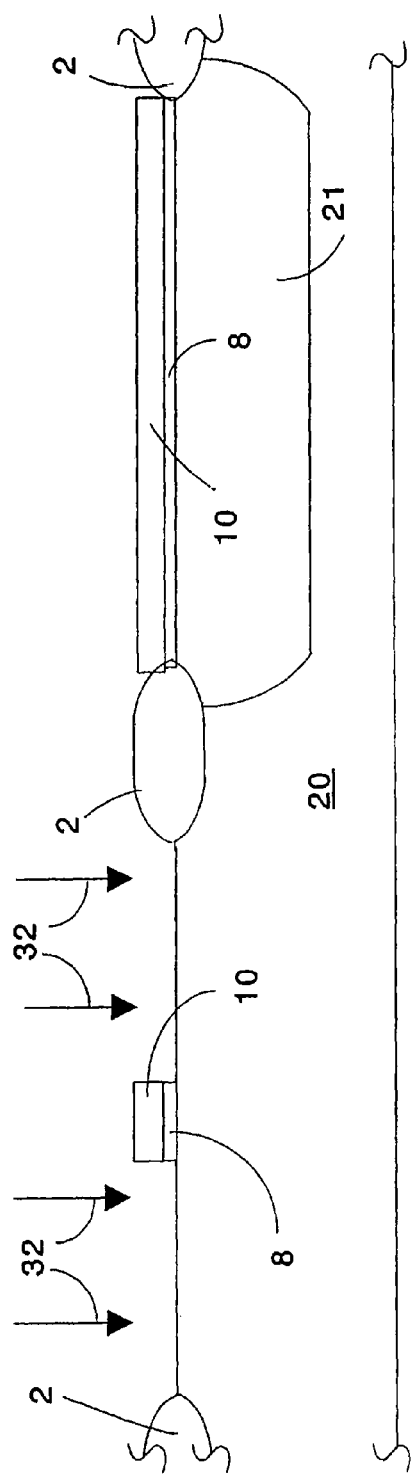

FIG. 2a depicts a substrate 20, for purposes of this discussion the substrate 20 is a p-type substrate; however the substrate could alternatively be a n-type substrate. A mask layer 27 is disposed over substrate 20 and photolithographically patterned to act as a mask for subsequent implantation. The substrate 20 is then exposed to ions 31. Ions 31 are chosen such that the ions 31 will result is a well of opposite conductivity type to that of substrate 20 (e.g. a n-type well 21 for the case of a p-type substrate 20). The mask layer 27 is removed and another mask (not shown) is disposed over substrate 20 and photolithographically patterned to act as a mask for subsequent thermal oxide growth. The substrate 20 is heated and field oxide 2 is grown as shown in FIG. 2b. The second mask is then removed.

Figure 2C:
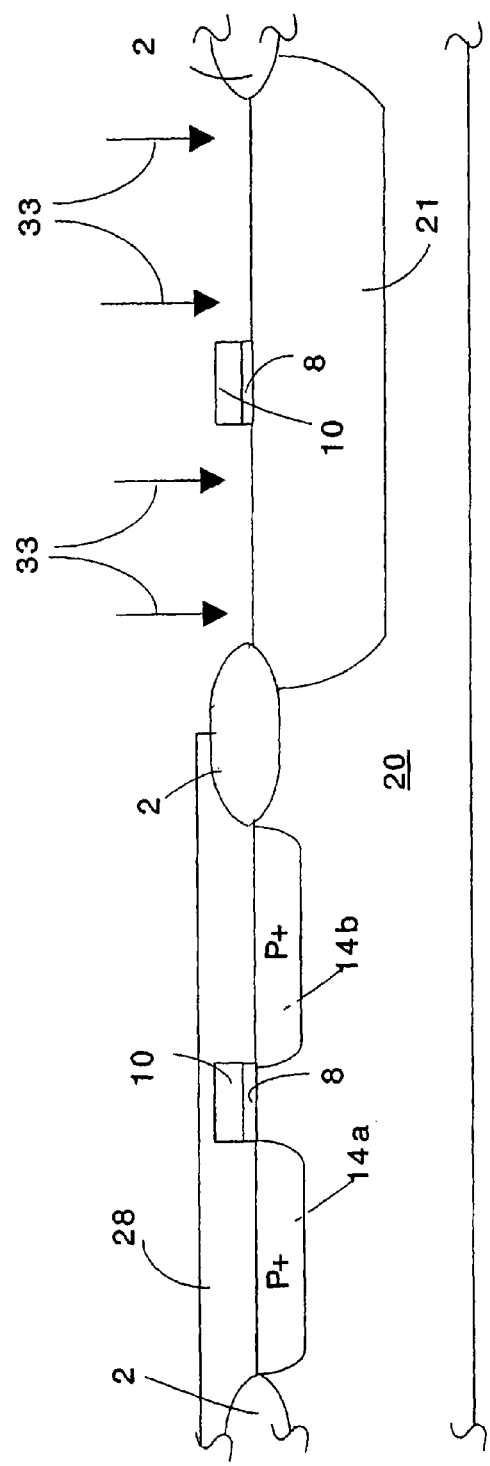

In FIG. 2b, the field oxide 2 acts to separate the transistors. The left side of the substrate will become the NMOS device, while the right side of the substrate will become the PMOS device. Next, a gate oxide layer 8 and a polysilicon layer 10 are disposed over the substrate 20 using standard semiconductor processing techniques. The polysilicon layer 10 and gate oxide layer 8 are etched on the left side of the substrate to form the poly gate for the NMOS device. The polysilicon layer 10 and gate oxide layer 8 are not etched on the right side, thus providing a mask over the PMOS device. The substrate 20 is then exposed to ions 32. This results in lightly doped density (LDD) active regions 14a, 14b, as shown in FIG. 2c. In this example, the ions 32 are chosen such that the LDD regions 14a, 14b are of the same conductivity type as substrate 20 (e.g. p-type in the case of a p-type substrate 20).

Figure 2D:
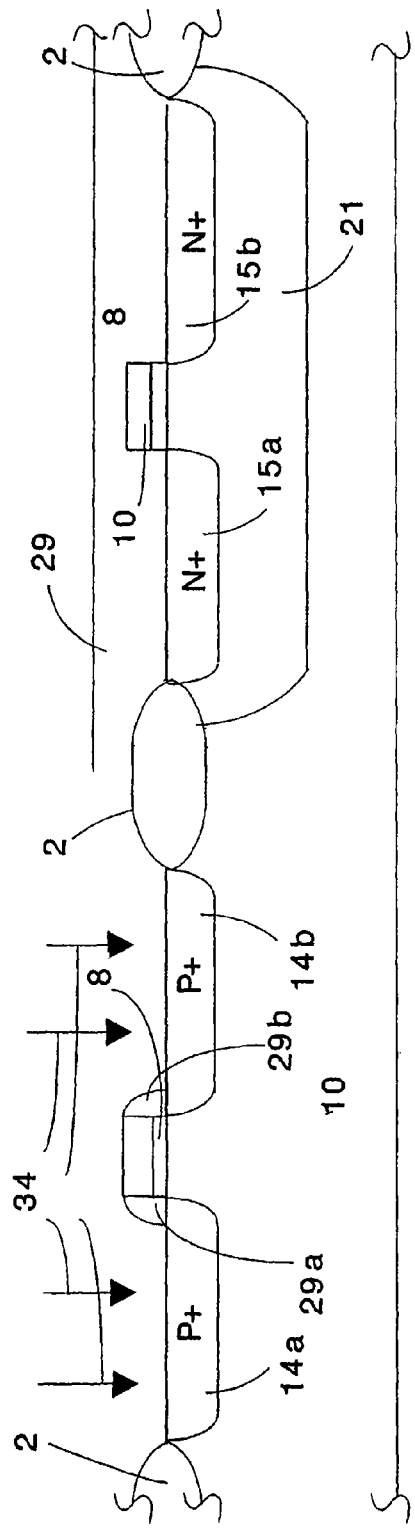

In FIG. 2c, the polysilicon layer 10 and gate oxide layer 8 are etched on the right side of the device to form the poly gate for the PMOS device. A mask 28 is disposed over the substrate 20 and photolithographically patterned to cover the NMOS device. The substrate 20 is then exposed to ions 33. This results in LDD regions 15a, 15b, as shown in FIG. 2d. In this example, the ions 33 are chosen such that the LDD regions 15a, 15b are of the same conductivity type as well 21 (e.g. n-type for this embodiment).

Figure 2E:
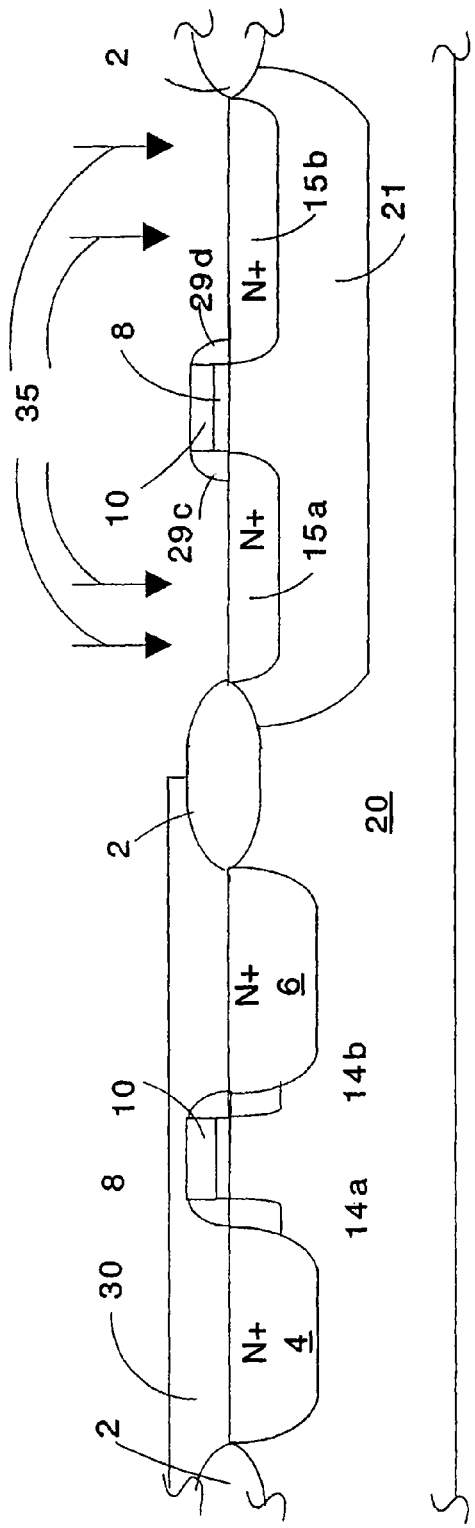

In FIG. 2d, a layer of oxide 29 is disposed on the substrate 20 and photolithographically patterned. On the NMOS side of the CMOS device, the oxide layer 29 is etched, through a suitable mask (not shown) to form sidewall spacers 29a, 29b. The sidewall spacers 29a, 29b are preferably of the same size as sidewall spacers that would be present on a standard NMOS device. The oxide layer 29 disposed over the PMOS device is not etched at this time. The substrate 20 is exposed to ions 34. This exposure results in active areas 4 and 6, as shown in FIG. 2e. The ions 34 are chosen such that the active areas 4, 6 are of opposite conductivity type to that of the LDD regions 14a, 14b (e.g. n-type in this embodiment). Therefore, the active areas 4, 6 have a first conductivity type, and the LDD regions 14a, 14b have a second conductivity type. Thus, active areas 4, 6 and LDD regions 14a, 14b are oppositely doped.

Figure 2F:
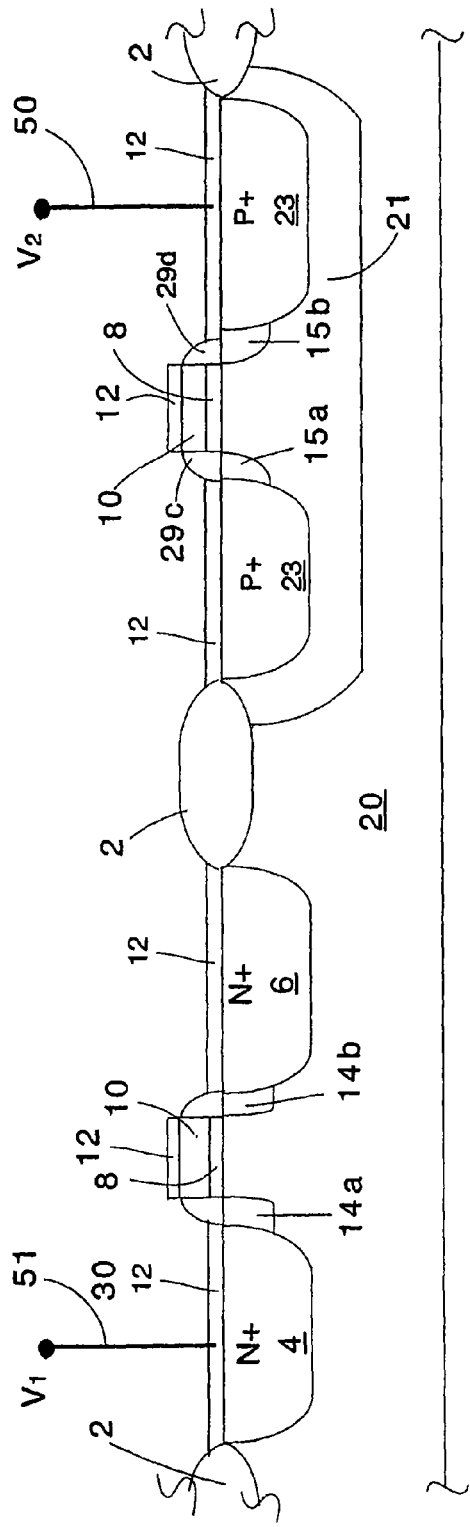

In FIG. 2e, the oxide layer 29 is etched to form sidewall spacers 29c, 29d adjacent to the poly gate of the PMOS device. The sidewall spacers 29c, 29d are preferably of the same size as sidewall spacers that would be present on a standard PMOS device. An oxide layer 30 is disposed over the substrate 20 and photolithographically patterned to cover the NMOS device. The substrate 20 is then exposed to ions 35. This results in the creation of active areas 23 and 25, as shown in FIG. 2f. The ions 35 are chosen such that the active areas 23, 25 are of opposite conductivity type to that of LDD regions 15a, 15b (e.g. p-type in this embodiment). Therefore, the active areas 23, 25 have a second conductivity type and LDD regions 15a, 15b have a first conductivity type. Thus, active areas 23, 25 and LDD regions 15a, 15b are oppositely doped.

In FIG. 2f, the oxide layer 30 is preferably etched leaving portions 30a and 30b, herein referred to as sidewall spacers. The sidewall spacers 30a, 30b, 29c and 29d are the same dimensions as the sidewall spacers for a standard CMOS device. Thus, the reverse engineer would have no information about the functionality of the device from the sizes of the sidewall spacers 30a, 30b, 29c, 29d.

As shown in FIG. 2f, an optional silicide layer 12 may be disposed and patterned over the NMOS and PMOS devices. For the NMOS device, the silicide layer 12 may allow for an electrical conductive path from $V_1$ 51 to substrate 20 through LDD region 14a, while the oppositely doped LDD regions 14a, 14b prevent an electrical path from active area 4 to active area 6. Thus, the NMOS device formed will be OFF for any standard voltage applied to $V_1$ 51.

Figure 3:
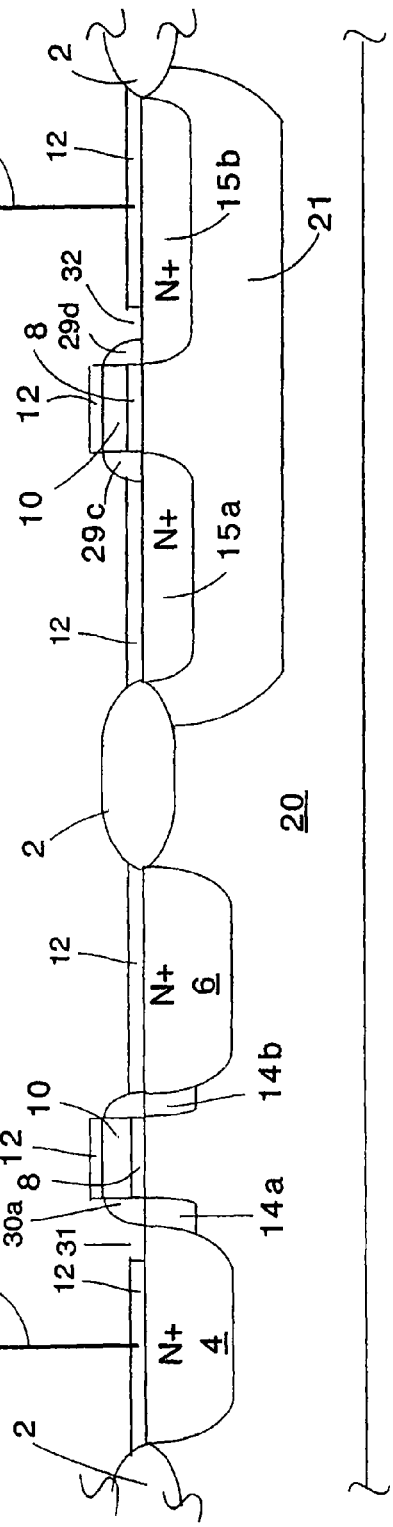
FIG. 3 depicts a cross-section of a CMOS device manufactured in accordance with the present invention wherein the silicide layer is pulled back from the sidewall spacer.

One skilled in the art will appreciate that the electrical path between $V_1$ 51 and the substrate 20 through LDD region 14a is dependent upon the tolerances of the process. If the silicide layer 12 overlaps a portion of the LDD region 14a, then the electrical path is formed. If instead, the silicide layer 12 does not overlap a portion of the LDD region 14a, as shown in FIG. 3, then there is no electrical path from $V_1$ 51 to substrate 20. However, if there is or is not an electrical path from $V_1$ 51 to substrate 20, the device formed will be OFF for any standard voltage applied to $V_i$ 51 due to the presence of LDD regions 14a, 14b, which prevent an electrical path from active region 4 to active region 6.

For the PMOS device, the silicide layer 12 may allow an electrical conductive path from $V_2$ 50 to n-well 21 through LDD region 15b, while the oppositely doped LDD regions 15a, 15b prevent an electrical path from active area 25 to active area 23. Thus, the device formed will be OFF for any standard voltage applied to $V_2$ 50. One skilled in the art will appreciate that the electrical path between $V_2$ 50 and n-well 21 through LDD region 15b is dependent upon the tolerances of the process. If the silicide layer 12 overlaps a portion of the LDD region 15b, then the electrical path is formed. If instead, the silicide layer 12 does not overlap a portion of the LDD region 15b, as shown in FIG. 3, then there is no electrical path from $V_2$ 50 to n-well 21. However, if there is or is not an electrical path from $V_2$ 50 to n-well 21, the device formed will be OFF for any standard voltage applied to $V_2$ 50 due to the presence of LDD regions 15a, 15b, which prevent an electrical path from active region 25 to active region 23.

One skilled in the art will appreciate that the shorting of the NMOS device to the substrate would not be preferred if the voltage applied to the substrate 20 was not the same as the voltage applied to $V_1$ 51. Many NMOS devices are connected such that the substrate 20 and $V_1$ 51 are connected to $V_{ss}$. However, if the voltage applied to substrate 20 was not the same as the voltage applied to $V_1$ 51, then a silicide block mask may be used to provide a silicide gap 31 that ensures that silicide layer 12 will not extend over LDD region area 14a, as shown in FIG. 3. Therefore, the silicide layer would be unable to provide an electrical path from $V_1$ 51 to substrate 20 through LDD region 14a. However, the presence of the LDD regions 14a, 14b being oppositely doped from active areas 4, 6 would prevent the transistor from turning ON when standard voltages are applied to $V_1$ 51. A silicide block mask may also be used to prevent the silicide from extending over LDD implant 15b by forming a gap 32 in the silicide layer 12.

Figure 4C:
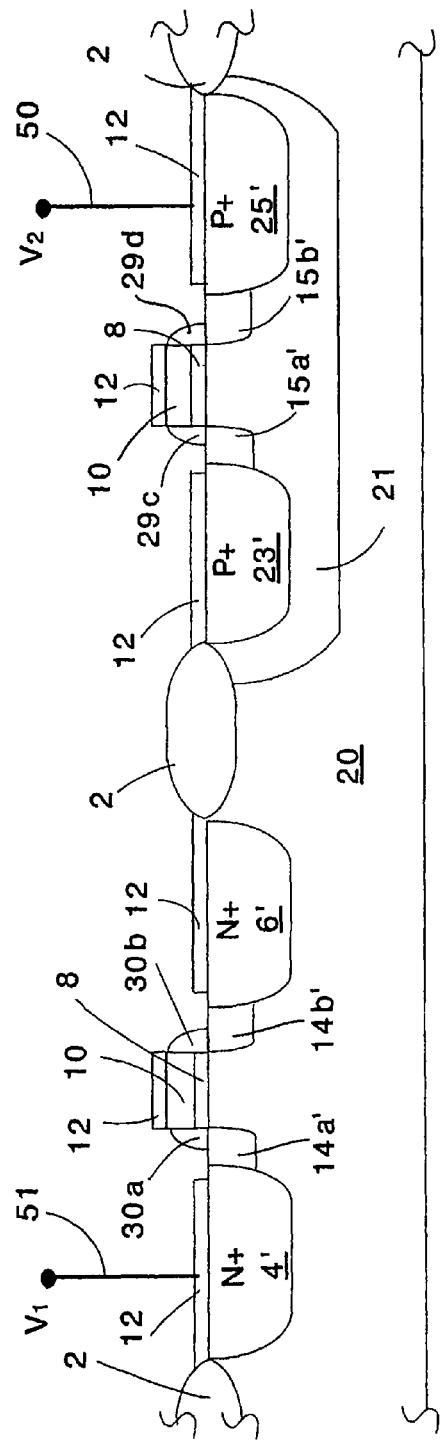

FIGS. 4a-4c depict another embodiment in accordance with the present invention. FIG. 4a is similar to FIG. 2d. The process steps described above in relation to FIGS. 2a-2c are utilized to reach a point where a change in the processing will now be described. As in the case of FIG. 2d, a layer of oxide 29 is disposed on the substrate 20 and photolithographically patterned. On the NMOS side of the CMOS device, the oxide layer 29 is etched, through a suitable mask (not shown) to form sidewall spacers 29a', 29b' shown in FIG. 4a, which spacers are larger (comparatively wider) than are the sidewall spacers 29a, 29b shown in FIG. 2d. The oxide layer 29 disposed over the PMOS device is not etched. The substrate 20 is exposed to ions 34. The exposure results in active areas 4' and 6', as shown in FIG. 4b. One skilled in the art will appreciate that the active regions 4' and 6' in this embodiment are smaller (comparatively less wide) than are the active regions 4,6 of the prior embodiment (see FIG. 2e). Thus, the remaining LDD regions 14a', 14b' in FIG. 4b are larger (comparatively wider) than the LDD regions 14a, 14b shown in the prior embodiment (see FIG. 2e). The oxide sidewall spacers 29a', 29b' are used to offset the active areas 4', 6' away from the gate 10 further than is normal. The ions 34 are chosen such that the active areas 4', 6' are of opposite conductivity type to that of the LDD regions 14a', 14b' (e.g. n-type in this embodiment). Therefore, the active areas 4', 6' have an opposite conductivity type than the LDD regions 14a', 14b'.

In FIG. 4b, the field oxide layer 29 is etched to form sidewall spacers 29c', 29d' which are larger (comparatively wider) than are the sidewall spacers 29c, 29d shown in the prior embodiment (see FIG. 2t). An oxide layer 30 is disposed over the NMOS device. The substrate 20 is exposed to ions 35. This results in active areas 23' and 25', as shown in FIG. 4c. One skilled in the art will appreciate that the active regions 23' and 25' are smaller (comparatively less wide) than active regions 23, 25 shown in FIG. 2f. Thus, the remaining LDD regions 15a', 15b' of FIG. 4c are larger than the LDD regions 15a, 15b shown in FIG. 2f. The field oxide sidewall spacers 29c', 29d' are used to offset the active areas 23', 25' away from the gate 10 further than is normal. The ions 35 are chosen such that the active areas 23', 25' are of opposite conductivity type to that of LDD regions 15a', 15b' (e.g. p-type in this embodiment). Therefore, the active areas 23', 25' have an opposite conductivity type than the LDD regions 15a', 15b'.

In FIG. 4c, the oxide layer 30 is preferably etched leaving portions 30a and 30b, herein referred to as conventionally sized sidewall spacers. Further, the sidewall spacers 29c' and 29d' are also preferably etched to form conventionally sized sidewall spacers 29c and 29d as shown in FIG. 4c. The sidewall spacers 30a, 30b, 29c and 29d are preferably of the same dimensions as conventional sidewall spacers. Thus, the reverse engineer would have no indication about the functionality of the device by the widths of the sidewall spacers 30a, 30b, 29c, 29d.

In one embodiment as shown in FIG. 4c, an optional silicide layer 12 is disposed over the NMOS and PMOS devices. The silicide layer 12 is placed such that the silicide layer 12 does not extend over LDD regions 14a', 14b', 15a', 15b', Thus, when a voltage $V_1$ is applied at point 51 or a voltage $V_2$ (which may be the same as voltage $V_t$) is applied to point 50, the current will pass through the silicide layer 12 and into active areas 4' and 25' respectively, but the current will not pass any further due to the oppositely doped LDD regions 14a', 14b', 15a', 15b'. Thus, the device will be off for any reasonable applied voltage. The purpose of the slightly smaller active regions 4', 6', 23', 25' shown in FIG. 4c is to allow larger LDD regions 14a', 14b', 15a', 15b'. The larger LDD regions 14a', 14b', 15a', 15b' may be desirable in some applications to prevent punch through.

Figure 5:
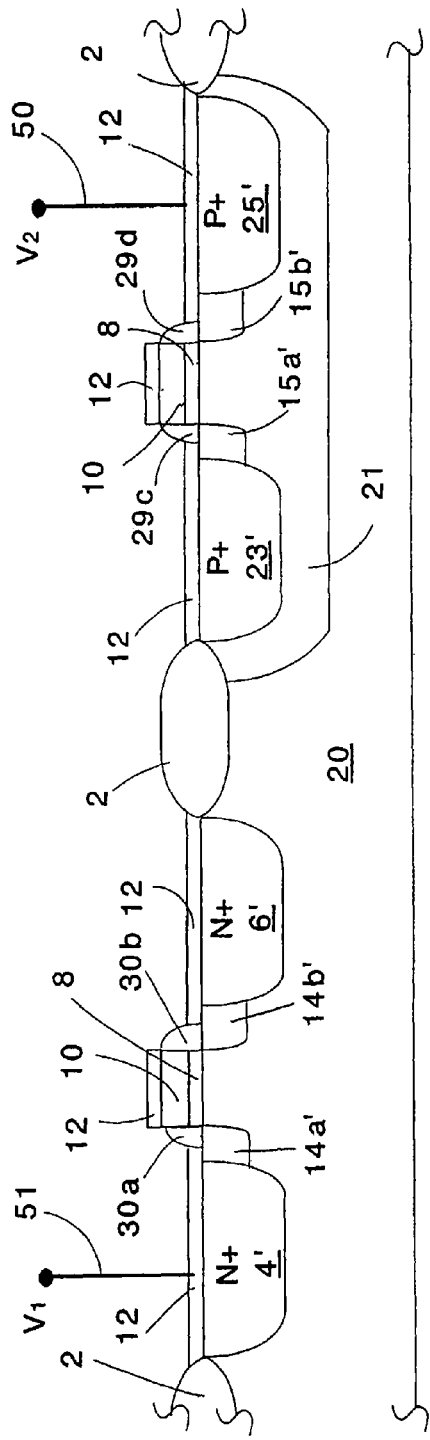
FIG. 5 depicts another embodiment of the present invention, wherein the silicide layer is placed over both the active regions and the LDD regions.

FIG. 5 depicts another embodiment of the present invention. The process steps used to achieve the device in FIG. 5 are almost identical to the steps for the embodiment of FIGS. 4a-4c as discussed above. However, in FIG. 5, the silicide layer 12 is placed over both the active regions 4', 6', 23', 25' as well as the LDD regions 14a', 14b', 15a', 15b'. In this embodiment, the NMOS device is always ON due to the electrical path created from the voltage $V_1$ 51 to the silicide layer 12, to the LDD region 14a', to the substrate 20, and then to the LDD region 14b'. The PMOS device is also always ON due to the electrical path from $V_2$ 50 to the silicide layer 12, to the LDD region 15b', to the well 21, and then to the LDD region 15a'

One skilled in the art will appreciate that there are many different types of CMOS manufacturing processes with different feature sizes. The present invention may be applied to any CMOS manufacturing process. For purposes of further clarification, typical dimensions will be supplied for a 0.35 µm process.

For both the PMOS and NMOS device, the dimensions of the oxide sidewall portions 29a, 29b, 29c, 29d, determine the size of the LDD regions 14a, 14b, 15a and 15b of FIGS. 2a-2f and FIG. 3. The LDD regions 14a, 14b, 15a and 15b, and thus the field oxide portions 29a, 29b, 29c and 29d, are preferably chosen to be sufficiently large to avoid punch through for standard voltages applied to $V_2$ 50, or $V_1$ 51 and as small as possible in order to avoid detection. In an embodiment utilizing a 0.35 µm process the LDD regions 14a, 14b, 15a, 15b are approximately 0.1 micrometers wide and a voltage of approximately 3.5 Volts is applied to $V_1$ 50 or $V_2$ 51.

In FIGS. 4a-4c and FIG. 5, the LDD regions 14a', 14b', 15a', 15b' are approximately 50% larger than a standard side wall spacer width, but the actual width of these LDD regions will depend on a number of factors, including the implant depth and doses.

For the CMOS device in FIG. 3, the dimensions of the optional silicide gap are preferably chosen such that the optional silicide gap is ensured to be over at least the LDD region 14a or 15b, taking into account the alignment tolerances for the process, thus preventing $V_1$ 51 from shorting to the substrate 20 or $V_2$ 50 from shorting to n-well 21. The dimensions of the optional silicide gap 31, 32 is dependent upon the mask alignment error for the process used. Typically, the optional silicide gap is less than 0.1 micrometers.

For the CMOS device in FIG. 4c, the dimensions of the optional silicide gap are preferably chosen such that the optional silicide gap will occur over at least the LDD regions 14a', 14b', 15a', 15b', taking into account the alignment tolerances for the processes used, thus preventing $V_1$ 51 from shorting to the substrate 20 or $V_2$ 50 from shorting to n-well 21.

The present invention provides an IC that is difficult to reverse engineer given that the conductivity type of the LDD region implants is very difficult to determine given the small dosage levels used in forming LDD regions. Additionally, the silicide layer is difficult to detect. As a result, the false transistor formed in accordance with the present invention will look operational to the reverse engineer. In a sea of millions of other transistors, these features will be difficult to detect easily, thus forcing the reverse engineer to examine every transistor closely. Such a task makes reverse engineering semiconductor chips using the present invention much less desirable and much more expensive due to the need to closely examine each and every transistor formed on a device.

Additionally, the invention is preferably not used to completely disable a multiple transistor circuit, but rather to cause the circuit to function in an unexpected or non-intuitive manner. For example, what appears to be an OR gate to the reverse engineer might really function as an AND gate with the non-functioning transistor(s). Or, what appears as an inverting input might really be non-inverting. The possibilities are almost endless and are almost sure to cause the reverse engineer so much grief that he or she gives up as opposed to pressing forward to discover how to reverse engineer the integrated circuit device on which these techniques are utilized.

Having described the invention in connection with certain preferred embodiments thereof, modification will now certainly suggest itself to those skilled in the art. As such, the invention is not to be limited to the disclosed embodiments, except as is specifically required by the appended claims.

What is claimed is:

1. A camouflaged circuit, comprising:
   a gate structure in a substrate;
   a first active region in the substrate;
   a first lightly doped density active region adjacent the first active region, said first lightly doped density active region having a first conductivity type and said adjacent first active region having a second conductivity type;
   a second active region in the substrate;
   a second lightly doped density active region adjacent the second active region, said second lightly doped density active region having a first conductivity type and said adjacent second active region having a second conductivity type;
   a conductive layer disposed over at least a portion of said first active regions; and
   a gap in the conductive layer such that the gap prevents an electrical path from the conductive layer to the first lightly doped density active region for a nominal voltage applied to the conductive layer;

wherein the circuit is non-operational when the nominal voltage is applied.

2. The camouflaged circuit of claim 1, further comprising:
an integrated circuit having a plurality of operable transistors;
wherein at least one camouflaged circuit is connected to one or more of the operable transistors to cause the integrated circuit to function in an unexpected or non-intuitive way; and
wherein said camouflaged circuit is non-operational when the nominal voltage is applied.

3. The camouflaged circuit of claim 1, wherein said conductive layer is a silicide layer.

4. The camouflaged circuit of claim 3, further comprising:
a gap in the silicide layer to prevent the silicide layer from contacting said first lightly doped density active regions such that the gap prevents an electrical path of a nominal voltage from said silicide layer to the first lightly doped density active region.

5. The camouflaged circuit of claim 1, further comprising:
a sidewall spacer disposed on the substrate on each side of the gate structure.

6. The camouflaged circuit of claim 5, wherein said first and second lightly doped density regions each have a width greater than the width of a sidewall spacer.

7. The camouflaged circuit of claim 5, wherein the sidewall spacers have the same dimensions as conventional sidewall spacers.

8. A camouflaged circuit, comprising:
a substrate;
source and drain structures in said substrate on either side of a gate structure, the source and drain structures being of a first conductivity type:
first lightly doped region in said substrate disposed in contact with said source structure and adjacent said gate structure, said first lightly doped region being of a second conductivity type;
a second lightly doped region in said substrate disposed in contact with said drain structure, said second lightly doped region being of the second conductivity type;
a first conductive layer disposed over and in contact with at least a portion of said source region; and
a second conductive layer disposed over and in contact with at least a portion of said drain region;
the first and second conductive layers having a mask selectable width for controlling whether said first and second conductive layers make contact with said first and said second lightly doped regions to thereby selectively control whether the circuit is permanently ON or permanently OFF;
an integrated circuit having a plurality of operable transistors;
wherein at least one camouflaged circuit is connected to one or more of the operable transistors to cause the integrated circuit to function in an unexpected or non-intuitive way.

9. The camouflaged circuit of claim 8, wherein the first and second conductive layers are in contact with said first and said second lightly doped regions whereby the circuit is always ON.

10. The camouflaged circuit of claim 8, wherein the first and second conductive layers are not in contact with said first and said second lightly doped regions whereby the circuit is always OFF.

11. The camouflaged circuit of claim 8, further comprising:
a sidewall spacer disposed on the substrate on each side of the gate structure.

12. The camouflaged circuit of claim 11, wherein said first and second lightly doped density regions each have a width greater than the width of a sidewall spacer.

13. The camouflaged circuit of claim 12, wherein the sidewall spacers have the same dimensions as conventional sidewall spacers.

14. A camouflaged circuit, comprising:
a gate structure in a substrate;
a first active region in the substrate;
a first lightly doped density active region adjacent the first active region, said first lightly doped density active region having a first conductivity type and said adjacent first active region having a second conductivity type;
a second active region in the substrate;
a second lightly doped density active region adjacent the second active region, said second lightly doped density active region having a first conductivity type and said adjacent second active region having a second conductivity type; and
a conductive layer disposed over said first active region and said first lightly doped density active region such that said conductive layer provides an electrical path for a nominal voltage from said conductive layer to the first lightly doped density active region;
wherein the circuit is non-operational when the nominal voltage is applied to said conductive layer.

15. The camouflaged circuit of claim 14, wherein said conductive layer is a silicide layer.

16. The camouflaged circuit of claim 14, further comprising:
an integrated circuit having a plurality of operable transistors;
wherein at least one camouflaged circuit is connected to one or more of the operable transistors to cause the integrated circuit to function in an unexpected or non-intuitive way; and
wherein said camouflaged circuit is non-operational when the nominal voltage is applied.

* * * * *